United States Patent
Liu et al.

(10) Patent No.: US 9,972,719 B1
(45) Date of Patent: May 15, 2018

(54) LAMINATE STRUCTURE OF THIN FILM TRANSISTOR

(71) Applicant: Microcosm Technology Co., Ltd., Tainan (TW)

(72) Inventors: Po-Tsun Liu, Hsinchu (TW); Sung-Wei Hung, Tainan (TW); Bo-Hung Lai, Tainan (TW)

(73) Assignee: Microcosm Technology Co., Ltd., Tainan (TW)

( * ) Notice: Subject to any disclaimer, the term of this patent is extended or adjusted under 35 U.S.C. 154(b) by 0 days. days.

(21) Appl. No.: 15/445,989

(22) Filed: Mar. 1, 2017

(30) Foreign Application Priority Data

Nov. 2, 2016 (TW) .............................. 105135446 A (51) Int. Cl.
| | |
|---|---|
| *H01L 29/78* | (2006.01) |
| *H01L 29/786* | (2006.01) |
| *H01L 27/12* | (2006.01) |
| *H01L 23/31* | (2006.01) |
| *H01L 23/29* | (2006.01) |

(Continued)

(52) U.S. Cl.
CPC ........ *H01L 29/78606* (2013.01); *C08G 73/22* (2013.01); *H01L 23/293* (2013.01); *H01L 23/3171* (2013.01); *H01L 27/1222* (2013.01); *H01L 27/1225* (2013.01); *H01L 29/1604* (2013.01); *H01L 29/24* (2013.01); *H01L 29/247* (2013.01); *H01L 29/4908* (2013.01); *H01L 29/51* (2013.01); *H01L 29/517* (2013.01); *H01L 29/518* (2013.01); *H01L 29/7869* (2013.01);

(Continued)

(58) Field of Classification Search
CPC ... H01L 29/24; H01L 29/78; H01L 29/78606; H01L 29/247; H01L 29/51; H01L 29/4908; H01L 29/7869; H01L 29/78693; H01L 29/1604; H01L 23/293; H01L 23/3171; H01L 27/1222; H01L 27/1225
USPC ............................................................ 257/43
See application file for complete search history.

(56) References Cited

U.S. PATENT DOCUMENTS

| 6,696,112 B2 | 2/2004 | Okuda et al. | |
|---|---|---|---|
| 7,977,676 B2 * | 7/2011 | Lee | ...................... H01L 27/1248 257/59 |

(Continued)

FOREIGN PATENT DOCUMENTS

| CN | 101097924 | 1/2008 |
|---|---|---|
| CN | 103855168 | 6/2014 |

(Continued)

OTHER PUBLICATIONS

"Office Action of Taiwan Counterpart Application," dated May 26, 2017, p. 1-p. 5, in which the listed references were cited.

(Continued)

*Primary Examiner* — Chuong A Luu
(74) *Attorney, Agent, or Firm* — JCIPRNET (57) ABSTRACT

A laminate structure of a thin film transistor includes a thin film transistor array and a passivation layer. The thin film transistor array includes a gate, a channel layer formed on the gate, a gate insulating layer formed between the gate and the channel layer, and a source and a drain formed on both sides of the channel layer. The passivation layer is formed on the thin film transistor array, and the passivation layer has at least one contact hole exposing the source or the drain, wherein the passivation layer is an oxazole-containing photosensitive polyimide (PSPI) resin.

7 Claims, 3 Drawing Sheets

(51) Int. Cl.
  *H01L 29/49* (2006.01)
  *H01L 29/51* (2006.01)
  *H01L 29/24* (2006.01)
  *H01L 29/16* (2006.01)
  *C08G 73/22* (2006.01)

(52) U.S. Cl.
  CPC .. *H01L 29/78669* (2013.01); *H01L 29/78693* (2013.01)

(56) References Cited

U.S. PATENT DOCUMENTS

| | | | |
|---|---|---|---|
| 9,087,747 | B2 | 7/2015 | Youn et al. |
| 2007/0284991 | A1 | 12/2007 | Egi et al. |
| 2010/0283105 | A1 | 11/2010 | Yamazaki et al. |
| 2012/0034744 | A1 | 2/2012 | Ohnuma |
| 2016/0086960 | A1* | 3/2016 | Wen ................. H01L 27/11507 257/295 |
| 2017/0139324 | A1* | 5/2017 | Yuan .................... G03F 7/0387 |

FOREIGN PATENT DOCUMENTS

| | | |
|---|---|---|
| CN | 102694000 | 5/2016 |
| CN | 102881713 | 5/2016 |
| TW | 200822226 | 5/2008 |
| TW | 200848899 | 12/2008 |
| TW | 200940605 | 10/2009 |
| TW | 201028794 | 8/2010 |
| TW | 201236084 | 9/2012 |
| TW | 201313781 | 4/2013 |
| TW | I461804 | 11/2014 |
| TW | 201533524 | 9/2015 |
| TW | 201626539 | 7/2016 |

OTHER PUBLICATIONS

Thi Thu Thuy Nguyen et al., "Impact of Passivation Conditions on Characteristics of Bottom-Gate IGZO Thin-Film Transistors", Journal of Display Technology, vol. 11, No. 6, Jun. 2015, 554-558.

* cited by examiner

LAMINATE STRUCTURE OF THIN FILM TRANSISTOR

CROSS-REFERENCE TO RELATED APPLICATION

This application claims the priority benefit of Taiwan application serial no. 105135446, filed on Nov. 2, 2016. The entirety of the above-mentioned patent application is hereby incorporated by reference herein and made a part of this specification.

BACKGROUND OF THE INVENTION

Field of the Invention

The invention relates to a laminate structure, and particularly relates to a laminate structure of a thin film transistor.

Description of Related Art

In recent years, the trend of display panels is toward thinness and lightweight. Therein, thin film transistors (TFTs) is mainly used in a driving circuit of a display, electrical characteristics of the thin film transistor will have a significant offset with the increase of usage time in the circuit. The main cause of the offset is from the effect of moisture and oxygen in the environment. Recently, the method of depositing a channel protective layer can be used to isolate from contacting the atmospheric environment. In the industry, a plasma enhanced chemical vapor deposition (PECVD) instrument is widely used to deposit silicon dioxide ($SiO_2$) as a protective layer material of the thin film transistor, and silane ($SiH_4$) and nitric oxide ($N_2O$) are required to be added for reaction when depositing. The study found that hydrogen ions contained in silane will run into a channel layer of the thin film transistor during the reaction, such that the devices are easily conducted. Furthermore, the PECVD equipment will have the phenomenon of plasma bombardment on the surface of the channel layer, such that stability and uniformity of the device will become worse. Additionally, in the manufacturing process, an etching step is required to define patterns of the silicon dioxide protective layer. It is easy to damage other thin films in the etching process, such that a lot of complicated experiments are required to test so as to reduce the damage of etching.

To minimize environmental effects on the transistor, a protective layer covering above the channel layer of the transistor is needed, so as to isolate from directly contacting the atmospheric environment. However, the silicon dioxide protective layer used in a traditional industry needs more complicated process and higher cost. Additionally, after the PECVD process, there will be a problem of hydrogen diffusion into the channel layer causing the device to be unstable. For instance, the phenomenon is published in "Impact of passivation conditions on characteristics of bottom-gate IGZO thin-film transistors," by Thi Thu Thuy Nguyen, et al., *Journal of Display Technology*, Vol. 11, No. 6, p. 554-558 on June, 2015.

SUMMARY OF THE INVENTION

The invention provides a laminate structure of a thin film transistor, which can effectively isolate a channel layer from contacting an atmospheric environment, and increase electrical stability and light stability.

The laminate structure of the thin film transistor of the invention includes a thin film transistor array and a passivation layer formed on the thin film transistor array. The thin film transistor array includes a gate, a channel layer formed on the gate, a gate insulating layer formed between the gate and the channel layer, and a source and a drain respectively formed on both sides of the channel layer. The passivation layer has at least one contact hole exposing the source or the drain, wherein the passivation layer may be an oxazole-containing photosensitive polyimide (PSPI) resin.

According to an embodiment of the invention, the oxazole-containing photosensitive polyimide resin may be obtained by copolymerizing a unit represented by formula (1) with a unit represented by formula (2) and a unit represented by formula (3):

(1)

(2)

(3)

In formula (1) to formula (3), $Ar_1$ is selected from the group consisting of formula (4) to formula (11):

(4)

(5)

(6)

-continued (7)

(8)

(9)

(10)

(11)

wherein X may be —O—, —C—, —C(CF$_3$)$_2$—, —C(CH$_3$)$_2$—, —CO—, or —SO$_2$—.

In formula (2), Ar$_2$ is selected from the group consisting of formula (12) to formula (14):

(12)

(13)

(14)

wherein Y may be —O—, —CH$_2$—, —C(CF$_3$)$_2$—, —C(CH$_3$)$_2$—, —CO—, —SO$_2$—, —S—, or

R may be OH, COOH, or COOR*, and R* represents

In formula (3), Ar$_3$ is selected from the group consisting of formula (15):

(15)

wherein m represents an integer of 1 to 20.

According to an embodiment of the invention, a material of the gate is ITO, Al, Mo/Al/Mo, or Ti/Al/Ti, for example.

According to an embodiment of the invention, a material of the gate insulating layer is SiO$_2$, Si$_3$N$_4$, Al$_2$O$_3$, or HfO$_2$, for example.

According to an embodiment of the invention, a material of the channel layer is a-IGZO, IZTO, AZTO, IWO, or a-Si, for example.

According to an embodiment of the invention, a material of the source and the drain is ITO, Al, Mo/Al/Mo, or Ti/Al/Ti, for example.

According to an embodiment of the invention, a thickness of the passivation layer is between 1 μm and 3 μm, for example, and a surface roughness of the passivation layer may be less than 5 nm.

Based on the above, the laminate structure of the thin film transistor of the invention includes the passivation layer having the oxazole-containing photosensitive polyimide resin. Since the passivation layer can effectively isolate the channel layer from contacting the atmospheric environment, the effect of Vth offset can be suppressed to improve the electrical stability of the device.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
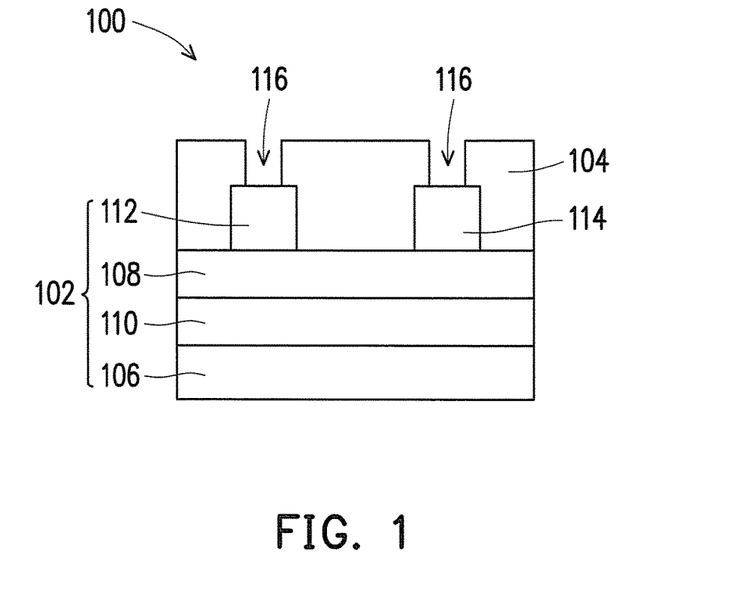
FIG. 1 is a schematic diagram of a laminate structure of a thin film transistor according to an embodiment of the invention.

FIG. 1 is a schematic diagram of a laminate structure of a thin film transistor according to an embodiment of the invention.

Referring to FIG. 1, a laminate structure of a thin film transistor 100 of the embodiment includes a thin film transistor array 102 and a passivation layer 104. The thin film transistor array 102 includes a gate 106, a channel layer 108 formed on the gate 106, a gate insulating layer 110 formed between the gate 106 and the channel layer 108, and a source 112 and a drain 114 formed on both sides of the channel layer 108. The passivation layer 104 is formed on the thin film transistor array 102, and the passivation layer 104 has at least one contact hole 116 exposing the source 112 or the drain 114. The passivation layer 104 may be an oxazole-containing photosensitive polyimide (PSPI) resin.

In the embodiment, the passivation layer 104 can be directly used for channel protection and can be planarized for connecting devices above. Since the process for depositing the thin film of such material is very simple, process steps for forming protective layers and manufacturing cost can be reduced. Specifically, in the prior art, an organic-inorganic material such as silicon oxide or silicon nitride is often used as the passivation layer, and then benzocyclobutene (BCB) is used as a planarization layer. This kind of manufacturing process is complex. Relatively speaking, the passivation layer 104 of the embodiment is the oxazole-containing PSPI resin, which can protect the channel layer 108 in the thin film transistor array 102 and is the role of the planarization layer. The manufacturing process can be effectively simplified, and it is conducive to thinning the overall laminate structure of the thin film transistor 100. However, the invention is not limited thereto. Other film layers, such as the planarization layer or other functional layers, may be provided on the passivation layer 104 depending on different circumstances.

Additionally, the oxazole-containing photosensitive polyimide (PSPI) resin may be obtained by copolymerizing a unit represented by formula (1) with a unit represented by formula (2) and a unit represented by formula (3):

In formula (1) to formula (3), $Ar_1$ is selected from the group consisting of formula (4) to formula (11).

(10)

(11)

wherein X may be —O—, —C—, —C(CF$_3$)$_2$—, —C(CH$_3$)$_2$—, —CO—, or —SO$_2$—.

In formula (2), Ar$_2$ is selected from the group consisting of formula (12) to formula (14):

(12)

(13)

(14)

wherein Y may be —O—, —CH$_2$—, —C(CF$_3$)$_2$—, —C(CH$_3$)$_2$—, —CO—, —SO$_2$—, —S—, or

R may be OH, COOH, or COOR*, and R* represents

In formula (3), Ar$_3$ is selected from the group consisting of formula (15):

(15)

wherein m represents an integer of 1 to 20.

A molar ratio of formula (1), formula (2), and formula (3) according to the embodiment is not limited.

The preparation method of the oxazole-containing photosensitive polyimide resin is not limited. A general polymerization method may be used. That is, diamine and dianhydride both including reactive groups are dissolved in a solvent to perform a polymerization reaction for forming a polyamic acid under nitrogen. Then, the polyamic acid is cyclodehydrated to form a soluble polyimide solution having a side chain containing a reactive group at about 180° C. using an entrainer by thermal solution imidization.

With the effects of the invention unaffected, in the preparation process of the oxazole-containing photosensitive polyimide resin, other reagents may be selectively added to increase reaction efficiency. For example, a catalyst, an inhibitor, an entrainer, or a combination thereof.

The catalyst includes but not limited to tetra-n-butylammonium bromide, triethylamine, imidazole, or pyrrole.

The inhibitor includes but not limited to hydroquinone, 4-methoxyphenol, or 3-aminobenzyl alcohol.

The entrainer includes but not limited to toluene or xylene.

In a preferred embodiment of the invention, the oxazole-containing photosensitive polyimide resin may further include a photosensitizer and a crosslinking agent.

The kinds of the photosensitizer are not limited. Preferably, the kinds of the photosensitizer are determined according to the kinds of the oxazole-containing photosensitive polyimide resin. The photosensitizer may include bis(2,4,6-trimethylbenzoyl)phenyl phosphineoxide, bis(2,6-difluoro-3-(1-hydropyrrol-1-yl)phenyl)titanocene, 2,4,6-trimethylbenzoyldiphenylphosphine oxide, 4-benzylbenzene-1,2,3-triyltris(3-diazo-3,4-dihydro-4-oxonaphtho-1-sulfonate, ethyl 3,4,5-tris [[(6-diazo-5,6-dihydro-5-oxo-1-naphthyl)sulfonyl]oxy]methylbenzoate, or methylenebisnaphthalene-1,2-diylbis(6-diazo-5,6-dihydro-5-oxonaphtho-1-sulfonate).

The kinds of the crosslinking agent are not limited. Preferably, the crosslinking agent includes tris(2-hydroxyethyl)isocyanurate triacrylate, pentaerythritol triacrylate, ethoxy bisphenol A diacrylate, or melamine.

In an embodiment, the composition of the oxazole-containing photosensitive polyimide resin is 100 parts by weight of the oxazole-containing photosensitive polyimide, from about 1 to 50 parts by weight of the photosensitizer, and from about 1 to 30 parts by weight of the crosslinking agent, for example.

Since the passivation layer 104 of the invention adopts the oxazole-containing PSPI resin, which can reduce water absorption of the resin and UV absorption of the resin body by the oxazole structure, good ability to block moisture and oxygen can be accomplished. Thus, electrical stability and light stability can be achieved by isolating the channel layer 108 from contacting the atmosphere.

The laminate structure of the thin film transistor 100 of the embodiment may be prepared by the following method, but is not limited thereto. It may be prepared by a known manufacturing method. Additionally, it is described in detail with FIG. 1.

First, a substrate (not shown) is prepared. The substrate may be a rigid substrate or a flexible substrate. The substrate is an insulating substrate, such as glass, plastic, or silicon substrates, but is not limited thereto. In the embodiment, the substrate is a silicon substrate, for example. After a surface of the silicon substrate is cleaned, a heavy doping treatment is performed to make the silicon substrate become an n-type silicon substrate as the gate 106, but it is not limited thereto. Alternatively, the silicon substrate may be used as a p-type silicon substrate.

Thereafter, the gate insulating layer 110 is deposited to cover the substrate and the gate 106 as shown in FIG. 1. A material of the gate insulating layer 110 may be $SiO_2$, $Si_3N_4$, $Al_2O_3$, or $HfO_2$. The method for depositing the gate insulating layer 110 may be a heating furnace tube method, a chemical vapor deposition (CVD), or other suitable methods.

In the embodiment, the heavily-doped substrate is used as the gate 106, but is not limited thereto. It may be formed a conductive film, such as ITO, Al, Mo/Al/Mo, or Ti/Al/Ti, on the substrate by a sputtering method, for example. Thereafter, the conductive film is treated by a photolithography and etching process to form the gate 106 on the substrate followed by depositing the gate insulating layer 110.

Then, an oxide semiconductor film, such as amorphous indium gallium zinc oxide (a-IGZO), indium zinc tin oxide (IZTO), aluminum zinc tin oxide (AZTO), or tungsten-doped indium oxide (IWO), is formed on the substrate that the gate insulating layer 110 has been formed thereon by a sputtering method. Then, the oxide semiconductor film is treated by a photolithography and etching process to form the channel layer 108 on the gate insulating layer 110 as shown in FIG. 1.

Then, a conductive film, such as ITO, Al, Mo/Al/Mo, or Ti/Al/Ti, is formed on the substrate that the channel layer 108 has been formed thereon by a sputtering method with a mask (e.g., Shadow Mask). The conductive film is used as the source (electrode) 112 and the drain (electrode) 114 covering on the gate insulating layer 110 and located on the both sides of the channel layer 108 as shown in FIG. 1. After that, an annealing process is performed to complete the fabrication of the thin film transistor array 102. The annealing process is performed under nitrogen at 300° C. for 1 hour, for example, but is not limited thereto.

Then, in an atmospheric environment, the oxazole-containing photosensitive polyimide (PSPI) resin is formed on the thin film transistor array 102 by using a roll coating method, a spin coating method, or a slit coating method, so as to form the passivation layer 104 having a thickness between about 1 µm and about 3 µm as shown in FIG. 1. Herein, since there is no need to perform vacuum plasma deposition, the channel layer 108 is not deteriorated. Thus, the subsequent annealing process or parameter adjustment required for traditional procedures is not necessary, such that the process for manufacturing the thin film transistor becomes simple, and the time can be saved. Also, the passivation layer 104 in the embodiment is formed by coating which has low cost compared with the vacuum plasma deposition equipment having high equipment cost.

At last, the contact hole 116 is defined in the passivation layer 104 on the source 112 or the drain 114 by a photolithography and etching process for the connection to subsequent devices. After exposure and development to expose the source 112 or the drain 114, it is required to perform an atmosphere heat treatment at 230° C., for example.

To verify the effect of the invention, experimental examples will be illustrated in detail. Also, electrical characteristics test, carrier mobility test, threshold voltage test, subthreshold slope test, stability test of positive gate voltage, stability test of negative gate voltage, and thin film surface roughness are evaluated. Furthermore, the invention is not limited to any of the following experimental examples.

<Electrical Characteristics Test for Device>

The electrical characteristics test for device is measured by a four-point probe electrical characteristics measuring instrument (Keithley Instruments-4200). An $I_D$-$V_G$ diagram is measured in the mode of 4 terminal-n-fet. The measurement parameters are set to: 10V of drain voltage, 0V of source voltage, and ±20V of gate voltage. The channel current value obtained at the drain is measured once each 0.6V.

<Carrier Mobility Test>

The $I_D$ of a saturation region in the measured $I_D$-$V_G$ diagram is extracted according to the following mathematical formula (I), so as to obtain the carrier mobility (µ).

$$\mu = \frac{L}{WC_{ox}}\left(\frac{\partial\sqrt{I_D}}{\partial V_G}\right)^2 \quad (I)$$

$C_{OX}$: gate capacitance, W: channel width, L: channel length.

<Threshold Voltage Test>

The threshold voltage (Vth) is extracted using a constant current method. The $V_G$ is defined as Vth when the $I_D$ in the saturation region is 8 A to 10 A.

<Subthreshold Slope Test>

The subthreshold slope (s.s.) is the voltage required for 10-fold rise in current.

<Stability Test of Applying Positive Gate Voltage (PBS)>

The stability test of PBS is to apply 25V (converted into an electric field of 2.5 MV) at the gate, and the $I_D$-$V_G$ diagram is measured after a period of time. In the experimental example, the measurement is performed after accumulating for 100 seconds, 200 seconds, 500 seconds, 1000 seconds, 1500 seconds, and 2000 seconds, and the effect of applying pressure for a long term on the channel by the gate is observed. The setting of the measurement parameters is the same as that for measuring the $I_D$-$V_G$ diagram. The measured threshold voltage offsets are as shown in Table 1.

<Stability Test of Long-Term Illumination and Applying Positive Gate Voltage (PBIS)>

Figure 2:
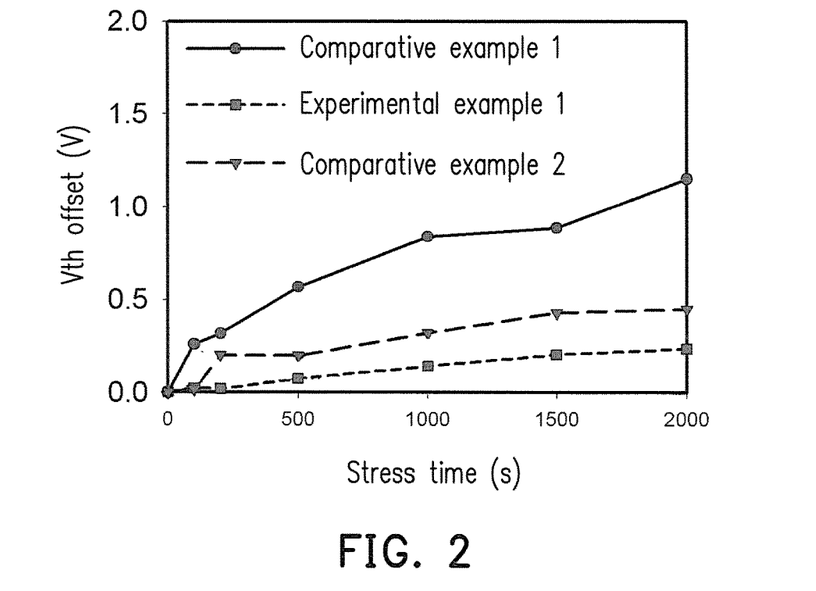
FIG. 2 is a positive gate bias illumination stress (PBIS) measurement results of Experimental example 1, Comparative example 1, and Comparative example 2 of the invention.

The stability test of PBIS during long-term illumination (the light source is a white back light source, and the illumination is 1378 Lux) is performed in the atmospheric environment. Here, the positive bias stress is to apply 25V (converted into an electric field of 2.5 MV) at the gate, and the electrical characteristics is measured after continuing 2000 seconds. Also, the $I_D$-$V_G$ diagram is measured after a period of time. In the experimental example, the measurement is performed after accumulating for 100 seconds, 200 seconds, 500 seconds, 1000 seconds, 1500 seconds, and 2000 seconds, and the effect of applying pressure for a long term on the channel by the gate is observed. The setting of the measurement parameters is the same as the setting of measuring the $I_D$-$V_G$ diagram. The measured threshold voltage offsets are as shown in FIG. 2.

<Stability Test of Long-Term Illumination and Applying Negative Gate Voltage (NBIS)>

Figure 3:
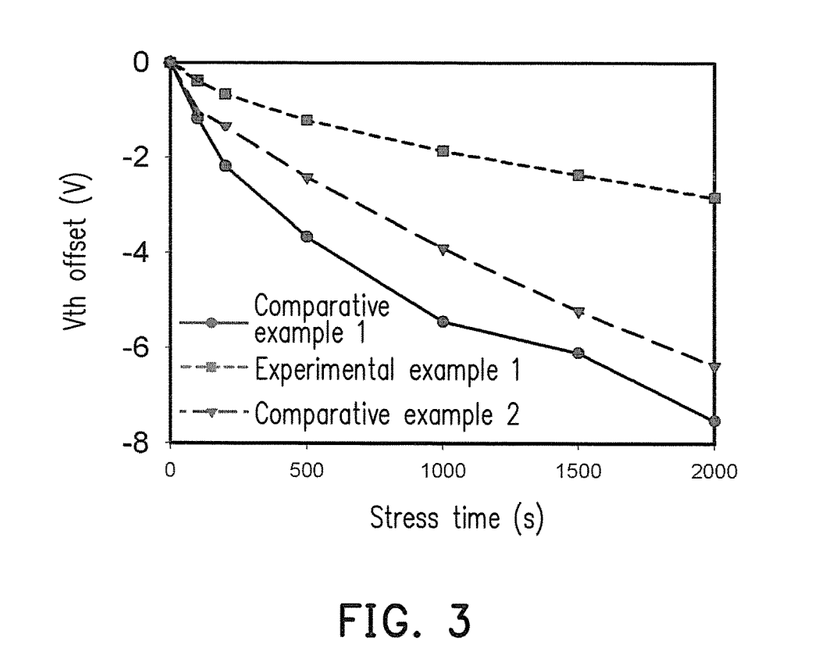
FIG. 3 is a negative gate bias illumination stress (NBIS) measurement results of Experimental example 1, Comparative example 1, and Comparative example 2 of the invention.

The stability test of NBIS during long-term illumination (the light source is a white back light source, and the illumination is 1378 Lux) is performed in the atmospheric environment. Here, the negative bias stress (NBS) is to apply the voltage of −25V at the gate, and the electrical characteristics is measured after continuing 2000 seconds. The parameter setting of the stability test of the negative gate voltage is the same as the parameter setting of the stability test of the positive gate voltage. The measured threshold voltage offsets are as shown in FIG. 3.

<Thin Film Surface Roughness>

The surface roughness is measured using an atomic force microscope (AFM) (Model: Dimension 3100, Digital instrument).

Synthesis Example 1

Figure 4:
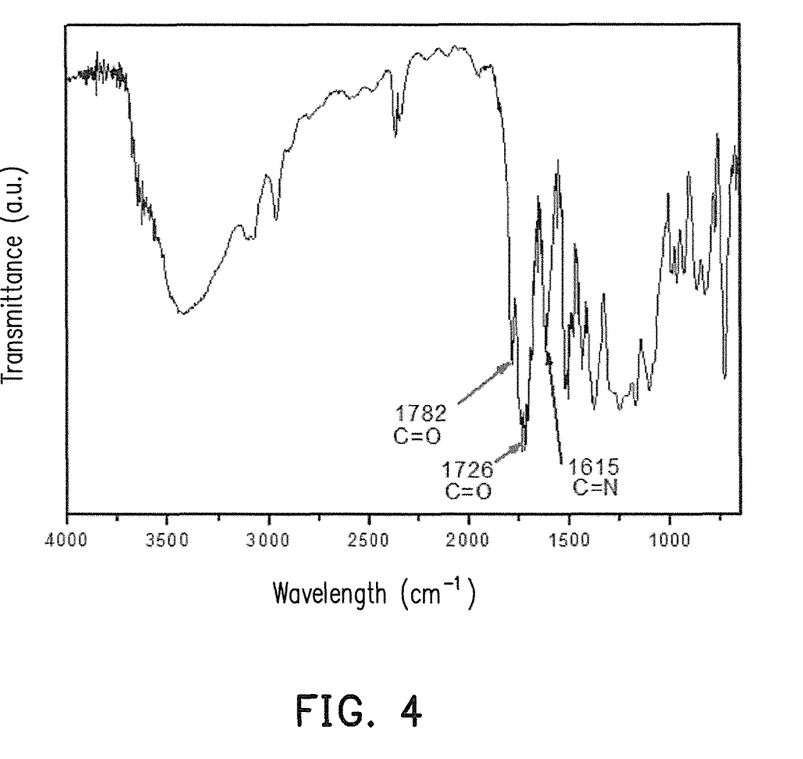
FIG. 4 is an FTIR spectrum of a viscous PI solution in Synthesis example 1.

1000 ml of three-neck round bottom flask with a mechanical stirrer and a nitrogen inlet was used. 60 mmole of hexafluoro-2,2-bis(3-amino-4-hydroxyphenyl), 30 mmole of 5-amino-2-(4-aminophenyl)benzoxazole, 10 mmole of 1,3-bis (3-aminopropyltetramethyldisiloxane), 50 mmole of bis(anhydrous trimellitic acid)ethylene, and 50 mmole of bis (3,4-dicarboxyphenyl) ether dianhydride were added thereto, and 400 g of NMP solvent was added thereto. After stirring for 4 hours, 80 g of xylene was added and then heated to 180° C. and stirred for 3 hours, and a viscous PI solution could be obtained after cooling. FIG. 4 is the FTIR spectrum of the product, wherein 1782 $cm^{-1}$ and 1726 $cm^{-1}$ are the characteristic peak of C═O of PI, and 1615 $cm^{-1}$ is the characteristic peak of C═N of oxazole.

Then, 6 g of the photosensitizer (4-benzylbenzene-1,2,3-triyltris(3-diazo-3,4-dihydro-4-oxonaphtho-1-sulfonate) and 3 g of the crosslinking agent (melamine) were added in 50 g of the viscous PI solution, and they were well mixed to obtain an oxazole-containing photosensitive polyimide resin composition.

Experimental Example 1

First, a thin film transistor array was manufactured.

A heavy doping treatment was performed after cleaning a silicon substrate, such that the silicon substrate became an n-type silicon substrate as the gate. Then, at 650° C. by the heating furnace tube, $SiO_2$ having a thickness of 100 nm was deposited as the gate insulating layer. An a-IGZO thin film having a thickness of 50 nm was deposited on the substrate formed with the gate insulating layer by a DC sputtering machine to be used as the channel layer. After that, an indium tin oxide (ITO) conductive film having a thickness of about 100 nm was formed on the overall substrate formed with the channel layer by a radio frequency sputtering machine with the Shadow Mask, and the source electrode and the drain electrode were formed on the both sides of the channel layer. The annealing process was performed under nitrogen at 300° C. for 1 hour. The fabrication of the thin film transistor array was completed.

Then, the photosensitive organic insulating film of Synthesis example 1 was uniformly coated on the thin film transistor array by using spin coating at a rotation speed of 8000 rpm. After soft baking at 110° C. for 2 minutes, a photolithography and etching process were sequentially performed on the photosensitive organic insulating film to define the contact hole exposing the source and the drain, and then a hard baking (baking at 230° C. for 1 hour) was performed, thereby obtaining the passivation layer having a thickness between about 1 μm and about 3 μm. At last, the source and the drain were wired respectively to perform the electrical characteristics test, and the comprehensive evaluation results are shown in Table 1.

Comparative Example 1

The manufacturing method is the same as Experimental example 1, but the step of coating the passivation layer is omitted. The comprehensive evaluation results are also shown in Table 1.

Comparative Example 2

The manufacturing method is the same as Experimental example 1, but the passivation layer was formed above the channel layer by a plasma enhanced chemical vapor deposition (PECVD). In the PECVD, silane ($SiH_4$) was reacted with nitrous oxide ($N_2O$) with the process condition of 300° C./2 min in order to deposit a $SiO_2$ layer having a thickness of 0.1 μm. The $SiO_2$ layer was patterned to form the contact hole. At last, the annealing was performed in a process condition of 400° C./hr under nitrogen. The comprehensive evaluation results are also shown in Table 1.

TABLE 1

| | Experimental example 1 (oxazole-containing PSPI) | Comparative example 1 (w/o passivation layer) | Comparative example 2 ($SiO_2$) |
| --- | --- | --- | --- |
| Carrier mobility (μ) | 16.61 | 13.12 | 14.60 |
| Threshold voltage (Vth) | 0.25 | 0.71 | −1.20 |
| Subthreshold slope (s.s.) | 0.386 | 0.334 | 0.641 |
| PBS (Vth offset) | 0.44 | 1.65 | 0.52 |
| PBIS (Vth offset) | 0.19 | 1.15 | 0.44 |
| NBIS (Vth offset) | −2.8 | −7.5 | −6.37 |
| Surface roughness (nm) | <1 nm | NA | <1 nm |

First, from carrier mobilities of Experimental example 1, Comparative example 1 to Comparative example 2, the carrier mobility of Experimental example 1 is higher than that of the structure without the passivation layer. In the measurement results of PBIS and NBIS, the Vth offset of Experimental example 1 is significantly lower, it indicates that the oxazole-containing photosensitive polyimide (PSPI) resin in the passivation layer is able to increase the electrical stability of the thin film transistor indeed.

Referring to FIG. 2 and FIG. 3 for details. FIG. 2 is PBIS measurement results of Experimental example 1, Comparative example 1, and Comparative example 2 of the invention, and FIG. 3 is NBIS measurement results of Experimental example 1, Comparative example 1, and Comparative example 2 of the invention.

The Vth offset in the measurement results of PBIS and NBIS of Experimental example 1 is significantly less compared with that in the measurement results of PBIS and NBIS of Comparative example 1 and Comparative example 2 in the invention.

From the results of Experimental example 1 of the invention, the carrier mobility is 16.61, the threshold voltage is 0.25, the subthreshold slope is 0.386, and the measured Vth offset of PBIS is 0.19 of the transistor. Thus, the performance of environmental stability of the thin film transistor in the invention can be that, the carrier mobility is 16.61 or more, the threshold voltage is 0.25 or less, the subthreshold slope is 0.386 or less, and the PBIS (Vth offset) is 0.19 or less respectively. Therefore, the environmental stability is excellent.

On the other hand, in Table 1, since the mechanism generated by applying the positive bias will be inhibited by the mechanism generated by illumination, the Vth offset tested by PBIS will less than the Vth offset tested by PBS.

In summary, the passivation layer of the invention is the oxazole-containing PSPI resin, which can not only protect the channel layer in the thin film transistor array plate, but is the role of the planarization layer. It is conducive to thinning the thin film transistor array plate. Also, since the passivation layer can effectively isolate the channel layer from contacting the atmospheric environment, the electrical stability and the light stability can be increased.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A laminate structure of a thin film transistor, comprising:
   a thin film transistor array, the thin film transistor array comprising:
     a gate;
     a channel layer, formed on the gate;
     a gate insulating layer, formed between the gate and the channel layer; and
     a source and a drain, respectively formed on both sides of the channel layer; and
   a passivation layer, formed on the thin film transistor array, and the passivation layer has at least one contact hole exposing the source or the drain, wherein the passivation layer is an oxazole-containing photosensitive polyimide (PSPI) resin, and the oxazole-containing photosensitive polyimide resin is a copolymer comprising a unit represented by formula (1), a unit represented by formula (2) and a unit represented by formula (3):

in formula (1) to formula (3), $Ar_1$ is selected from the group consisting of formula (4) to formula (11):

wherein X is —O—, —C—, —C(CF$_3$)$_2$—, —C(CH$_3$)$_2$—, —CO—, or —SO$_2$—;

$Ar_2$ is selected from the group consisting of formula (12) to formula (14):

-continued

(13)

(14)

wherein Y is —O—, —CH$_2$—, —C(CF$_3$)$_2$—, —C(CH$_3$)$_2$—, —CO—, —SO$_2$—, —S—, or

R is OH COOH or COOR*, R* represents

Ar$_3$ is selected from the group consisting of formula (15):

(15)

wherein m represents an integer of 1 to 20.

2. The laminate structure of the thin film transistor according to claim 1, wherein a material of the gate is ITO, Al, Mo/Al/Mo, or Ti/Al/Ti.

3. The laminate structure of the thin film transistor according to claim 1, wherein a material of the gate insulating layer is SiO$_2$, Si$_3$N$_4$, Al$_2$O$_3$, or HfO$_2$.

4. The laminate structure of the thin film transistor according to claim 1, wherein a material of the channel layer is a-IGZO, IZTO, AZTO, IWO, or a-Si.

5. The laminate structure of the thin film transistor according to claim 1, wherein a material of the source and the drain is ITO, Al, Mo/Al/Mo, or Ti/Al/Ti.

6. The laminate structure of the thin film transistor according to claim 1, wherein a thickness of the passivation layer is between 1 μm and 3 μm.

7. The laminate structure of the thin film transistor according to claim 1, wherein a surface roughness of the passivation layer is less than 5 nm.

* * * * *